(12) United States Patent
Ogawa

(10) Patent No.: US 6,291,811 B1
(45) Date of Patent: Sep. 18, 2001

(54) SOLID STATE IMAGE SENSING ELEMENT IMPROVED IN SENSITIVITY AND PRODUCTION COST, PROCESS OF FABRICATION THEREOF AND SOLID STATE IMAGE SENSING DEVICE USING THE SAME

(75) Inventor: Chihiro Ogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/585,620

(22) Filed: Jun. 2, 2000

Related U.S. Application Data

(62) Division of application No. 09/056,858, filed on Apr. 8, 1998, now Pat. No. 6,104,021.

(30) Foreign Application Priority Data

Apr. 9, 1997 (JP) .................................................. 9-90579

(51) Int. Cl.⁷ ............................ H01L 27/14; H01L 31/00
(52) U.S. Cl. .................................... 250/208.1; 250/214.1; 250/216; 438/69
(58) Field of Search ............................. 250/208.1, 208.2, 250/214 R, 214.1, 216, 227.11; 257/431, 432, 433, 435; 438/57, 59, 60, 64, 65, 66, 67, 69, 71, 73

(56) References Cited

U.S. PATENT DOCUMENTS

| | | | |
|---|---|---|---|
| 5,323,052 | 6/1994 | Koyama | 257/432 |
| 5,371,397 | 12/1994 | Maegawa et al. | 257/432 |
| 5,763,292 | * 6/1998 | Harada et al. | 438/69 |
| 5,844,289 | 12/1998 | Teranishi et al. | 257/432 |
| 6,002,139 | 12/1999 | Katagiri | 250/556 |
| 6,104,021 | * 8/2000 | Ogawa | 250/208.1 |

FOREIGN PATENT DOCUMENTS

| | | |
|---|---|---|
| 61-268059 | 11/1986 | (JP) . |
| H1-146545 | 10/1989 | (JP) . |
| 2-65171 | 3/1990 | (JP) . |
| 3/84685 | 4/1991 | (JP) . |
| 4-233759 | 8/1992 | (JP) . |
| H4-226073 | 8/1992 | (JP) . |
| 4-322466 | 11/1992 | (JP) . |
| 5-21700 | 1/1993 | (JP) . |
| H5-291546 | 11/1993 | (JP) . |
| 6-188399 | 7/1994 | (JP) . |
| 7-106537 | 4/1995 | (JP) . |
| 7-106538 | 4/1995 | (JP) . |
| 9-27608 | 1/1997 | (JP) . |

* cited by examiner

Primary Examiner—John R. Lee
(74) Attorney, Agent, or Firm—Sughrue, Mion, Zinn, Macpeak & Seas, PLLC

(57) ABSTRACT

A solid state image sensing element has a miniature lens buried in a transparent interlayer insulating layer over a photo diode formed in a semi-conductor substrate, and the miniature lens occupies an area wider than an area occupied by the photo diode so that the solid state image sensing element is sensitive without sacrifice of production cost.

9 Claims, 9 Drawing Sheets

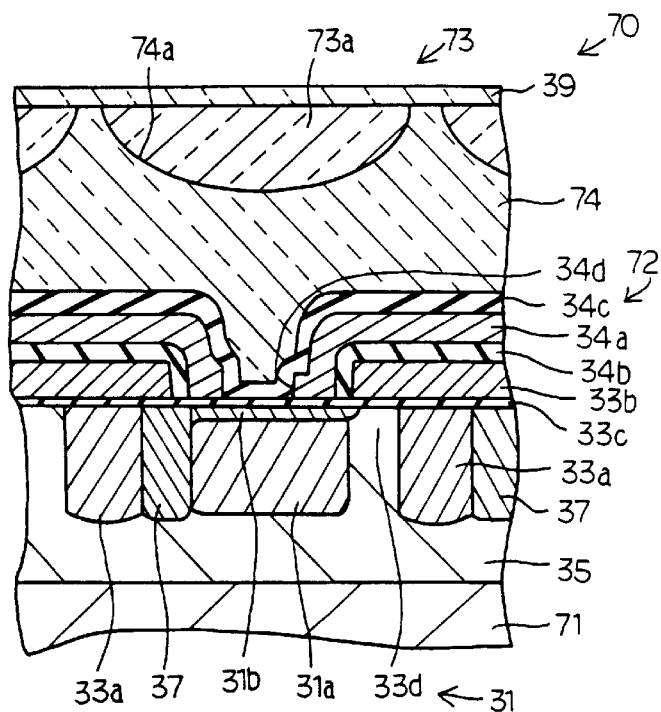
Fig. 8
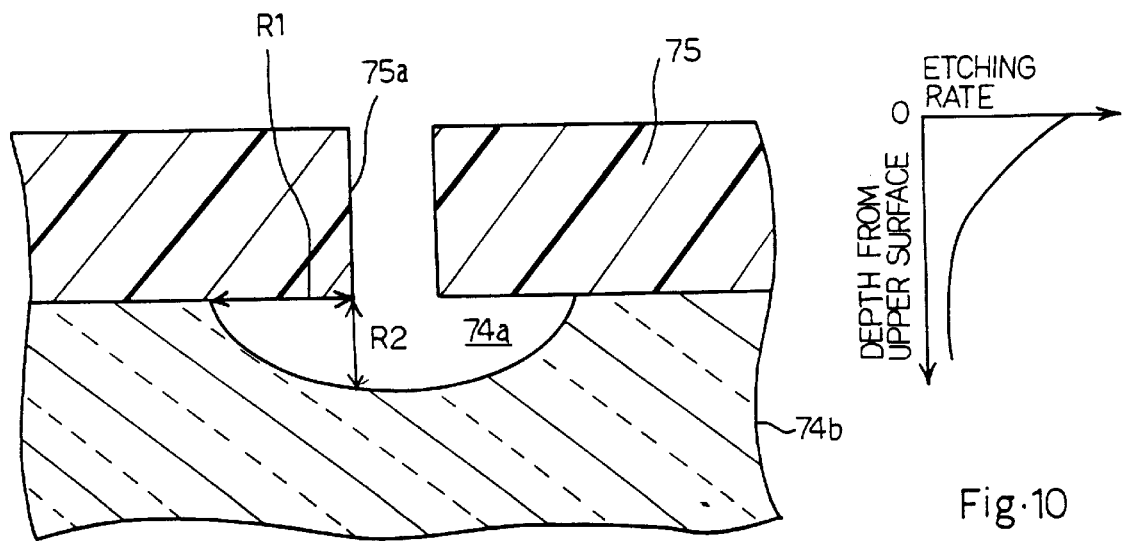
Fig. 9
Fig. 10

SOLID STATE IMAGE SENSING ELEMENT IMPROVED IN SENSITIVITY AND PRODUCTION COST, PROCESS OF FABRICATION THEREOF AND SOLID STATE IMAGE SENSING DEVICE USING THE SAME

This is a divisional of application Ser. No. 09/056,858 filed Apr. 8, 1998, now U.S. Pat. No. 6,104,021, the disclosure of which is incorporated herein by reference.

FIELD OF THE INVENTION

This invention relates to a solid state image sensing device and, more particularly, to a solid state image sensing element, a process of fabrication thereof and a solid state image sensing device equipped with the solid state image sensing element.

DESCRIPTION OF THE RELATED ART

A CCD (Charge Coupled Device) type image sensing device is a typical example of the solid state image sensing device, and is described hereinbelow. However, the following description is applicable to another kind of solid state image sensing device such as a MOS (Metal-Oxide-Semiconductor) type solid state image sensing device.

FIG. 1 illustrates the first prior art slid state image sensing device. A p-type well 1 is formed in a surface portion of an n-type silicon substrate 2, and an n-type impurity region 3 is nested in the p-type well 1. A heavily-doped p-type impurity region 4 is formed over the n-type impurity region 3, and the heavily-doped p-type impurity region 4 and the n-type impurity region 3 form a p-n junction serving as a photo diode.

An n-type charge transfer region 5 is further formed in the p-type well 1, and is spaced from the photo diode, i.e., the n-type impurity region 3 and the heavily-doped p-type impurity region 4. Though not shown in FIG. 1, photo diodes are arranged along the n-type charge transfer region 5, and the photo diodes and the n-type charge transfer region 5 form in combination an image sensing line. A heavily doped p-type impurity region 6 is formed in such a manner as to of the image sensing line, and electrically isolates the photo diodes and the n-type charge transfer region 5 from adjacent image sensing lines. Thus, a large number of photo diodes are arrayed in the p-type well 1. However, description is focused on only one of the photo diodes and the n-type charge transfer region 5.

A read-out transistor 7 is associated with the photo diode and the n-type charge transfer region 5. In detail, a surface portion of the p-type well 1 between the photo diode and the n-type charge transfer region 5 provides a channel region 7a, and the channel region 7a is covered with a gate oxide layer 7b. A charge transfer electrode 7c is formed on the gate oxide layer 7b, and is covered with a silicon oxide layer 8. The silicon oxide layer 8 is over-lain by a photo shield layer 9, and an opening 9a is formed in the photo shield layer 9 over the photo diode. For this reason, image-carrying light is incident onto the photo diode through the opening 9a, and the n-type charge transfer region 5 is prevented from the light.

The photo shield layer 9 is covered with a transparent insulating layer 10, and the opening 9a is filled with the transparent material. A thick photo resist layer 11 is laminated on the transparent insulating layer 10, and provides a flat upper surface 11a. An on-chip lens 12 is formed on the flat upper surface 11a, and is located over the photo diode so as to focus the image carrying light on the photo diode. The thick photo resist layer 11 is made from photo resist solution through a baking. The on-chip lens 12 is also made from a piece of photo resist. A photo resist layer is patterned into pieces of photo resist through lithographic techniques, and the piece of photo resist thermally cured at 150 degrees to 200 degrees in centigrade. Then, the piece of photo resist is shaped into a semi-spherical configuration as shown.

The second prior art solid state image sensing device is disclosed in Japanese Patent Publication of Unexamined Application (JPA) No. 2-65171, and FIG. 2 illustrates the second prior art solid state image sensing device. A p-type well 21 is formed in a surface portion of an n-type silicon substrate 22, and an n-type impurity region 23 is nested in the p-type well 21. A heavily-doped p-type impurity region 24 is formed over the n-type impurity region 23, and the heavily-doped p-type impurity region 24 and the n type impurity region 23 form a p-n junction serving as a photo diode.

An n-type charge transfer region 25 is further formed in the p-type well 21, and is spaced from the photo diode. The photo diode and the n-type charge transfer region 25 form an image sensing line together with other photo diodes. A heavily doped p-type impurity region 26 is formed in such a manner as to surround the image sensing line, and electrically isolates the photo diodes and the n-type charge transfer region 25 from adjacent image sensing lines.

A read-out transistor 27 is associated with the photo diode and the n-type charge transfer region 25, and comprises a channel region 27a, a gate oxide layer 27b over the channel region 27a and a charge transfer electrode 27c formed on the gate oxide layer 27b. The charge transfer electrode 279 is covered with a silicon oxide layer 28, and the silicon oxide layer 28 is overlain by a photo shield layer 29. An opening 29a is formed in the photo shield layer 29 over the photo diode, and allows image-carrying light to be incident onto the photo diode through the opening 29a. The photo shield layer 29 prevents the n-type charge transfer region 25 from the incident light. The photo shield layer 29 is topographically covered with a transparent insulating layer 30, and the transparent insulating layer 30 forms a deep recess 30a. The deep recess 30a is located over the photo diode. The deep recess 30a is partially filled with silica glass, and the piece of silica glass 31 forms a curved upper surface 32. The curved upper surface 32 forms a shallow recess nested in the deep recess 30a. The shallow recess is filled with silicon nitride, and the silicon nitride has a refractive index larger than the silica glass. For this reason, the piece of silicon nitride 33 serves as a lens. The upper surface of the lens 33 is planarized as shown.

The on-chip lens 12 occupies the wide area over the photo diode 3/4 and the n-type charge transfer region 5, and gathers the incident light fallen thereonto. For this reason, the photo diode 3/4 is sensitive to the variation of the incident light. However, the first prior art solid state image sensing device encounters a problem in high price. As described hereinbefore, the on-ship lens 12 is formed of photo resist solidified through the baking, and, accordingly, is brittle. The brittle on-chip lens is liable to be broken during the fabrication of the first prior art solid state image sensing device, and decreases the production yield. This makes the price of the first prior art solid state image sensing device high.

Another reason for the high price is serious influences of dust. The on-chip lenses 12 project from the flat upper surface 11a of the photo resists layer 11, and form valleys therebetween. If a dust particle falls into the valley, the dust particle is hardly eliminated from the valley, and makes the product defective. For this reason, the first prior art solid state image sensing device requires extremely high cleanliness, and such an extremely high clean ambience increases the production cost of the first prior art solid state image sensing device.

Yet another reason for the high price is a complicated packaging structure. The on-chip lens 12 has the exposed curved surface. If the exposed curved surface is held in contact with transparent layer which has a large refractive index, the on-ship lens 12 loses the convergent function. For this reason, the on-chip lens 12 is required to be exposed to the air, or is covered with an extremely low refractive index material layer. The manufacturer takes these requirements into account, and designs the package for the first prior art solid state image sensing device. The package is complicated, and increases the production cost.

The second prior art solid state image sensing device is less costly, because the curved surface of the lens 33 is embedded into the piece of silica glass 31. However, the second prior art solid state image sensing device suffers from a low sensitivity. The low sensitivity is derived from the small lens 33. The shallow recess defines the lens 33, and the shallow recess is defined in the deep recess 30a. The deep recess 30a is defined by the transparent insulating layer topographically extending on the photo shield layer 29 around the opening 29a, and only the photo diode 23/24 is exposed to the opening 29a. The n-type charge transfer region 25 is never exposed to the openings 29a. For this reason, the lens 33 merely occupies an area over the photo diode 23/24, and can not gather the incident light fallen over the n-type charge transfer region 25. Thus, there is a trade-off between the first prior art solid state image sensing device and the second prior art image sensing device.

SUMMARY OF THE INVENTION

It is therefore an important object of the present invention to provide a solid state image sensing element, which is low in production cost and high in sensitivity.

It is another important object of the present invention to provide a process of fabricating the solid state image sensing element.

It is yet another important object of the present invention to provide a solid state image sensing device in which the solid state image sensing element serves as an essential component.

In accordance with one aspect of the present invention, there is provided a solid state image sensing element fabricated on a substrate comprising a photo-electric converting element occupying a first area of the substrate and converting incident light to photo carrier, a first transparent layer covering the photo-electric converting element, formed of a first transparent material and having a first recess occupying a second area wider than the first area and a second transparent layer provided in the first recess and formed of a second transparent material larger in refractive index than the first transparent material so as to serve as a lens.

In accordance with another aspect of the present invention, there is provided a process for fabricating a solid state image sensing element, comprising the steps of preparing a substrate, forming a photo-electric converting element in a first area of the substrate, covering the photo-electric converting element with a first transparent layer formed of a first transparent material, forming a mask layer on the first transparent layer having an opening over a central sub-area of the first area, isotropically etching the first transparent so as to form a first recess and filling the first recess with a second transparent material larger in refractive index than the first transparent material so as to form a second transparent layer serving as a lens.

In accordance with yet another aspect of the present invention, there is provided a solid state image sensing device comprising a substrate, an array of solid state image sensing elements fabricated on the substrate and including a plurality of photo-electric converting element each occupying a first area of the substrate and converting incident light to photo carrier, a first transparent layer covering the plurality of photo-electric converting elements, formed of a first transparent material and having first recesses each occupying a second area wider than the first area over one of the plurality of photo-electric converting elements and a plurality of second transparent layers respectively provided in the first recesses and formed of a second transparent material larger in refractive index than the first transparent material so as to serve as lenses, respectively, and a package accommodating the substrate and having a transparent portion with an inner surface held in contact with the array of solid state image sensing elements.

BRIEF DESCRIPTION OF THE DRAWINGS

The features and advantages of the solid state image sensing element, the fabrication process and the solid state image sensing device will be more clearly understood from the following description taken in conjunction with the accompanying drawings in which:

FIG. 8 is a cross sectional view showing the structure of still another solid state image sensing element according to the present invention;

FIG. 9 is a cross sectional view showing a semi-elliptical recess formed under a photo resist layer;

FIG. 10 is a graph showing relation between an etching rate and a depth from the boundary between a transparent layer and the photo resist layer;

DESCRIPTION OF THE PREFERRED EMBODIMENTS

First Embodiment

Figure 1:
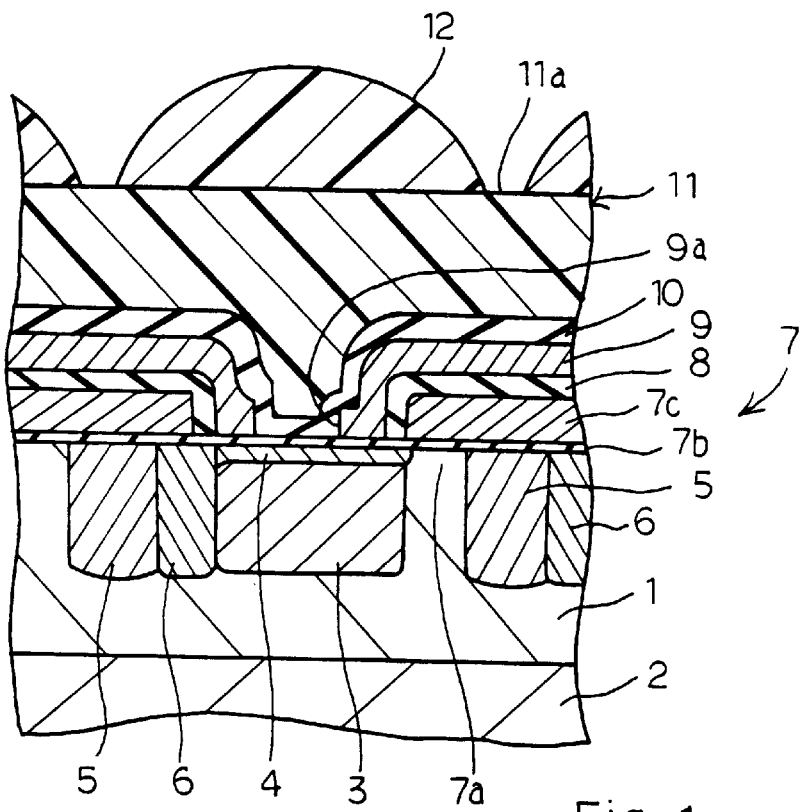
FIG. 1 is a cross sectional view showing the structure of the first prior art solid state image sensing device.
Figure 2:
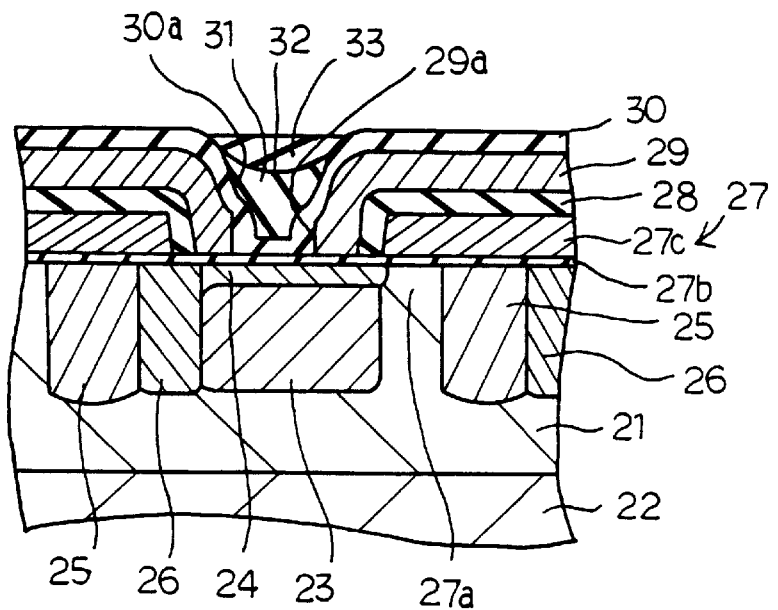
FIG. 2 is a cross sectional view showing the structure of the second prior art solid state image sensing device.
Figure 3:
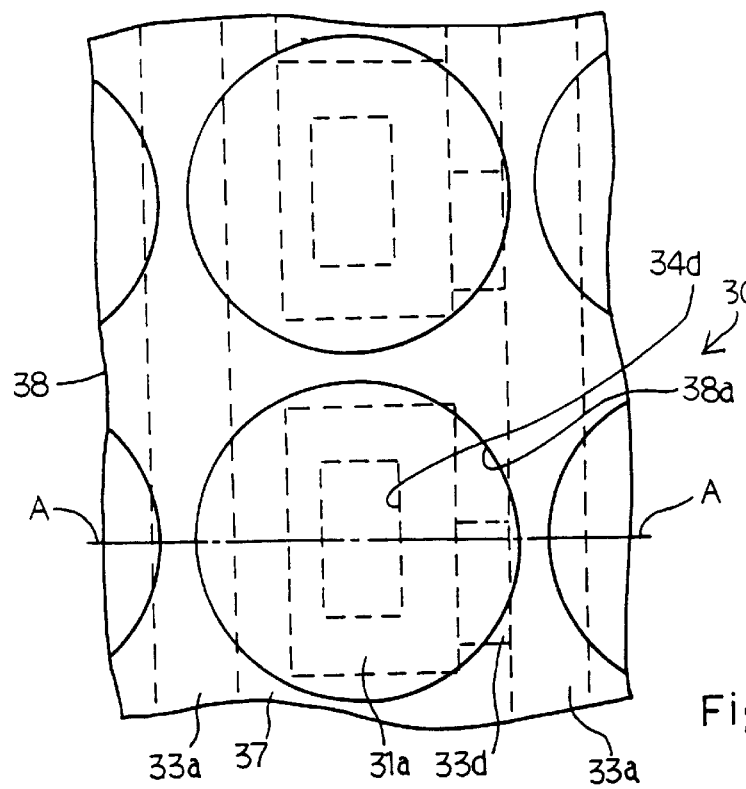
FIG. 3 is a plane view showing a solid state image sensing element fabricated on a semiconductor substrate according to the present invention.
Figure 4:
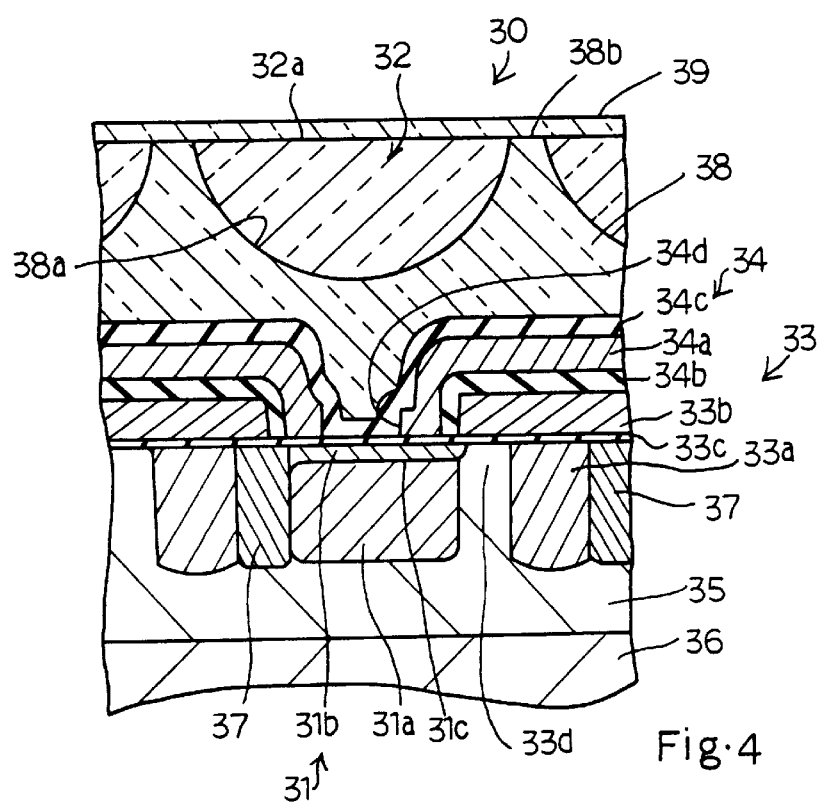
FIG. 4 is a cross sectional view taken along line A—A of FIG. 3 and showing the structure of the solid state image sensing element.

Referring to FIGS. 3 and 4 of the drawings, a solid state image sensing element 30 embodying the present invention largely comprises a photo diode 31 and a buried miniature lens 32. The solid state image sensing element 30 form a solid state image sensing device together with other solid state image sensing elements, shift registers 33 and a photo-shield structure 34. The other solid state image sensing elements are similar in structure to the solid state image sensing element 30, and make a plurality of image sensing lines. Each image sensing line includes a plurality of solid state image sensing elements. The shift registers 33 are respectively associated with the image sensing lines, and FIG. 3 illustrates the solid state image sensing element 30 incorporated in one of the image sensing lines and the associated shift register 33. The solid state image sensing element 30 and the shift register 34 are hereinbelow described in detail.

A p-type well 35 is formed in a surface portion of an n-type silicon substrate 36, and the image sensing line and the associated shift register 33 are formed in the p-type well 35. A heavily doped p-type impurity region 37 isolates the image sensing line and the associated shift register 33 from the adjacent image sensing line/shift register.

An n-type impurity region 31a and a heavily-doped p-type region 31b form a p-n junction 31c serving as the photo diode, and converts incident light to photo carrier. The amount of photo carrier is proportional to the intensity of the incident light. The photo carrier is accumulated in the n-type impurity region 31a.

The shift register 33 includes an n-type charge transfer region 33a formed in the p-type well 35 and charge transfer electrodes 33b patterned on a thin insulating layer 33c covering the p-type well 35. The n-type charge transfer region 33a extends along the image sensing line, and is spaced from the n-type impurity region 31a by a channel region 33d. Predetermined charge transfer electrodes 33b projects from the area over the n-type charge transfer region 33a to the area over the channel region 33d as shown in FIG. 4, and the predetermined charge transfer electrodes 33b are electrically connected to a read-out signal line (not shown). When a read-out pulse is applied to the predetermined charge transfer electrode 33b, a conductive channel is formed between the n-type impurity region 31a and the n-type charge transfer region 33a, and the photo carrier is read out from the photo diode to the shift register 33.

The photo shield structure 34 includes a non-transparent photo shield layer 34a sandwiched between a silicon oxide layer 34b and a transparent insulating layer 34c. The photo shield layer has an opening 34d, and a part of the thin insulating layer 33c over the heavily-doped p-type region 31b is exposed to the opening 34d. The transparent insulting layer 34c topographically extends over the photo shield layer 34a, and the area of the thin insulating layer 33c is covered with the transparent insulating layer 34c. The photo diode 31, the shift register 33 and the photo shield structure 34 are similar to those of the prior art already described.

The photo shield structure 34 is covered with a thick transparent layer 38, and a generally semi-spherical recess 38a is formed in the surface portion of the thick transparent layer 38. The generally semi-spherical recess 38a occupies an area over the photo diode 31, the channel region 33d and a part of the n-type charge transfer region 33a as will be seen in FIG. 3. The upper surface 38b between the generally semi-spherical recesses 38a is flat. The buried miniature lens 32 is shaped into a generally semi-spherical configuration corresponding to the generally semi-spherical recess 38a, and is snugly received in the generally semi-spherical recess 38a. Thus, the buried miniature lens 32 is much wider than the opening 34d. The buried miniature lens 32 is formed of transparent material larger in refractive index than the transparent material forming the thick transparent layer 38.

The buried miniature lens 32 has a flat upper surface 32a, and the flat upper surface 32a is substantially coplanar with the upper surface 38b of the thick transparent layer 38. The upper surfaces 32a and 38b are covered with a transparent protective layer 39 of silicon nitride.

As will be understood from the foregoing description, the buried miniature lens 32 directs the incident light falling over the channel region 33d and the part of the n-type charge transfer region 33a to the photo diode 31, and surely improves the sensitivity. The buried miniature lens 32 provides the flat upper surface 32a coplanar with the upper surface 38b of the thick transparent layer 38, and any valley is not formed between the buried miniature lens 32 and the thick transparent layer 38. For this reason, a dust particle is easily removable, and does not seriously damages the solid state image sensing device. This means that the solid state image sensing element is not so sensitive to the environment. The transparent protective layer prevents the buried miniature lens from undesirable force, and the buried miniature lens is not easily broken. Thus, the solid state image sensing element allows the manufacturer to reduce the production cost of the solid state image sensing device.

Figure 5A:
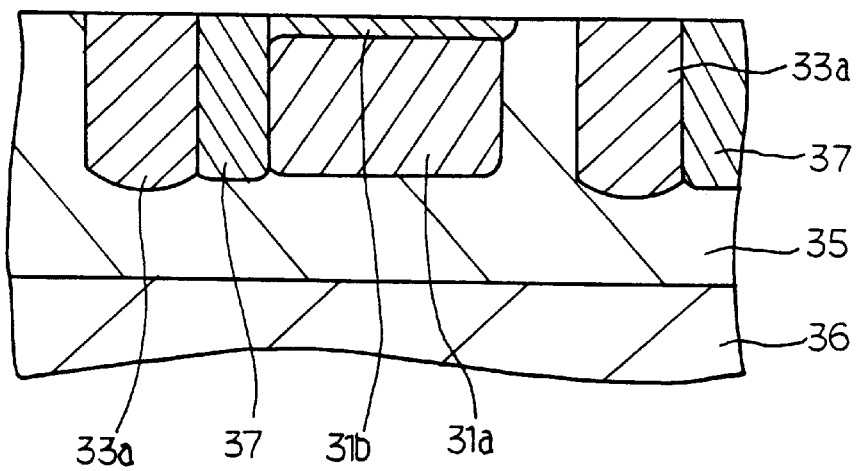
FIGS. 5A to 5C are cross sectional views showing essential steps of a process for fabricating the solid state image sensing element according to the present invention.
Figure 5B:
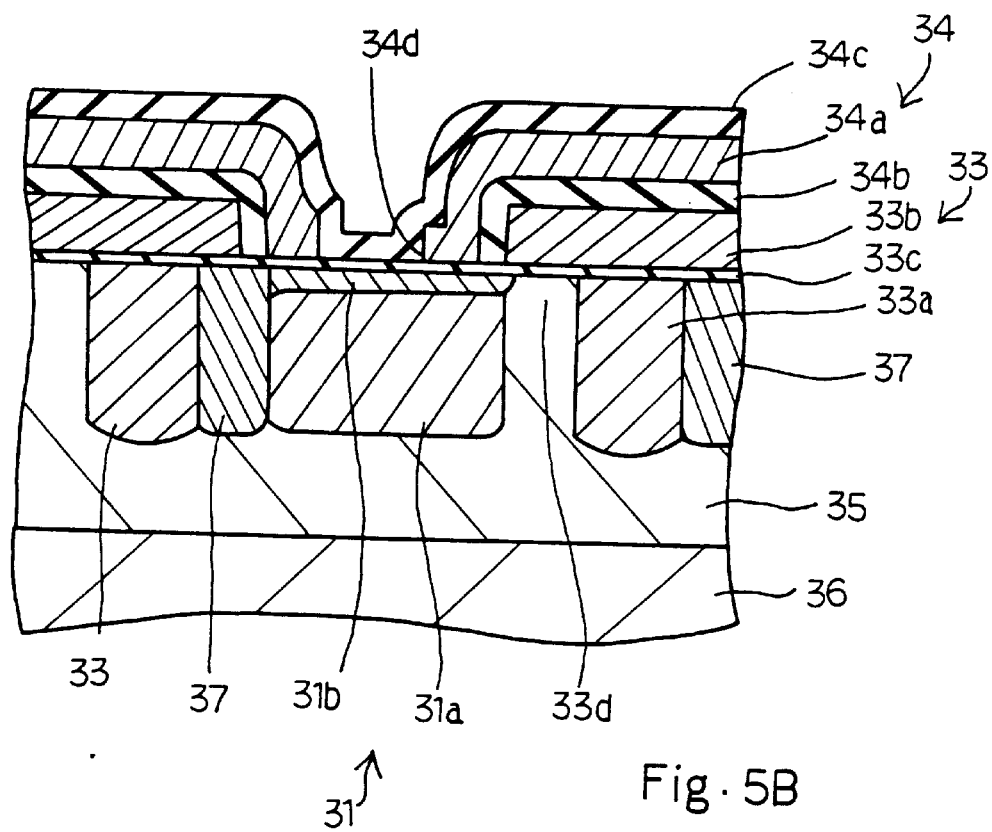
Figure 5C:
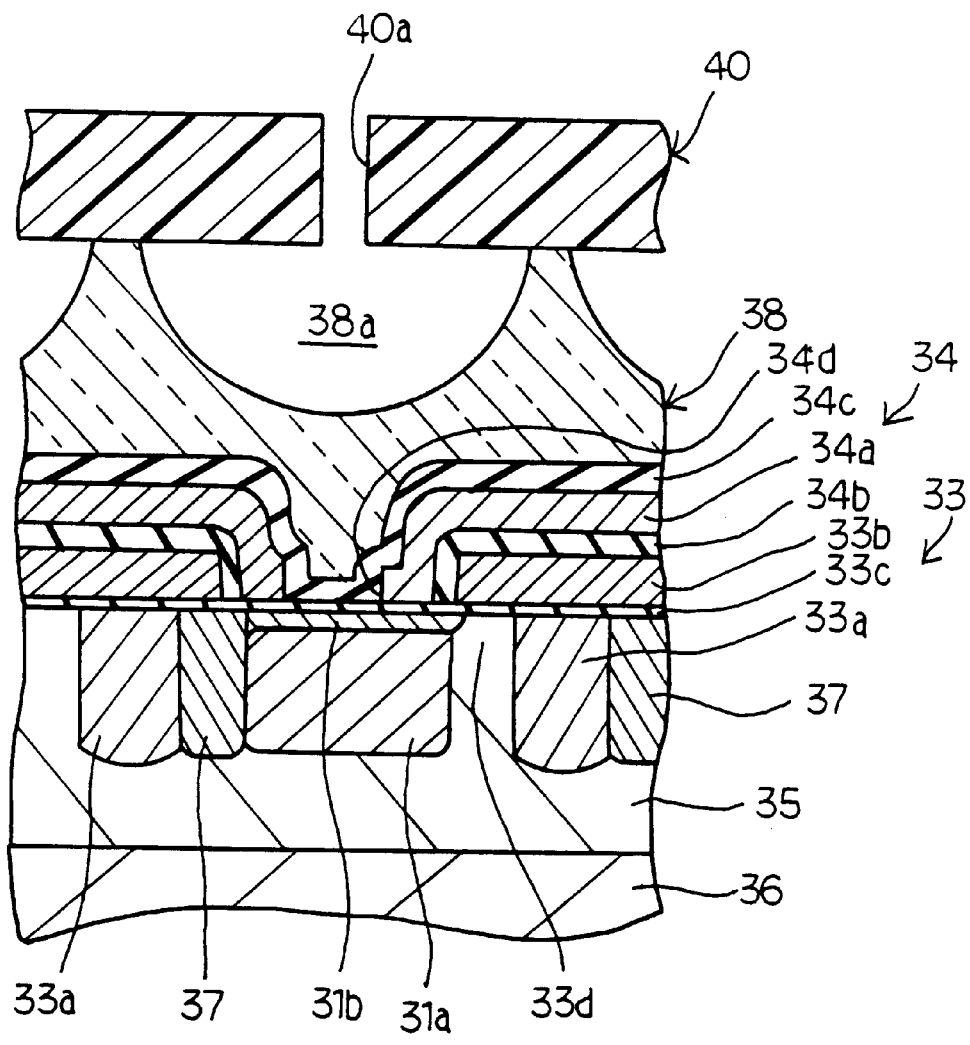

The solid state image sensing element 30 is fabricated through a process illustrated in FIGS. 5A to 5C. The process starts with preparation of the n-type silicon substrate 36. Photo resist solution is spread over the major surface of the n-type silicon substrate 36, and is baked so as to form a photo resist layer (not shown). A pattern image is transferred from a photo mask (not shown) to the photo resist layer, and forms a latent image in the photo resist layer. The latent image is developed so as to pattern the photo resist layer into a photo resist ion-implantation mask (not shown). Thus, the photo resist ion-implantation mask is formed from the photo resist layer through the lithographic techniques.

A predetermined surface area of the n-type silicon substrate 36 is exposed to an opening of the photo resist ion-implantation mask, and p-type dopant impurity is ion implanted into the exposed surface portion of the n-type silicon substrate 36. The ion-implanted p-type dopant impurity forms the p-type well 35. The photo resist ion-implantation mask is stripped off.

A photo resist ion-implantation mask (not shown) is formed on the n-type silicon substrate 36 by using the lithographic techniques, and a surface portion of the p-type well 35 is exposed to an opening of the photo resist ion-implantation mask. The surface portion is assigned to the heavily doped p-type impurity region 37. P-type dopant impurity is ion implanted into the exposed surface portion, and forms the heavily doped p-type impurity region 37 for the electrical isolation.

Similarly, the n-type impurity region 31a, the n-type charge transfer region 33a and the heavily-doped p-type impurity region 31b are formed by using the lithographic techniques and the ion-implantation. The surface portion between the n-type impurity region 31a and the n-type charge transfer region 33a provides a channel region 33d for reading out the photo carrier. The resultant semiconductor structure of this stage is shown in FIG. 5A.

Subsequently, the thin insulating layer 33c is formed over the upper surface of the resultant semiconductor structure. The thin insulating layer 33c is formed from a single silicon oxide film or a combination of silicon oxide film and a silicon nitride film. Phosphorous-doped polysilicon is deposited over the entire surface of the thin insulating layer 33c, and a photo resist etching mask (not shown) is formed on the phosphorous-doped polysilicon layer by using the lithographic techniques. The phosphorous-doped polysilicon layer is selectively etched away, and is formed into the predetermined charge transfer electrode 33b. The predetermined charge transfer electrode 33b is thermally oxidized, and is covered with silicon oxide. The doped-polysilicon is deposited over the entire surface of the resultant semiconductor structure, and a photo resist etching mask (not shown) is formed on the doped-polysilicon layer by using the lithographic techniques. The doped polysilicon layer is selectively etched away, and is formed into the other charge transfer electrodes (not shown).

Silicon oxide is grown over the other charge transfer electrodes, and forms the silicon oxide layer 34b together with the silicon oxide thermally grown on the predetermined charge transfer electrode 33b. Non-transparent material is deposited to 200 nanometers to 500 nanometers thick over the resultant semi-conductor structure, and a photo resist etching mask (not shown) is formed on the non-transparent material layer by using the lithographic techniques. The non-transparent material layer may be an aluminum layer, a tungsten layer or a composite layer thereof Using the photo resist etching mask, the non-transparent material layer is selectively etched away, and is formed into the photo-shield layer 34a. The non-transparent material layer is removed from the predetermined area of the thin insulating layer 33c over the photo diode 31, and, accordingly, the photo shield layer 34a has the opening 34d over the photo diode 31. Subsequently, transparent insulating material is deposited over the entire surface of the resultant semiconductor structure, and forms the transparent insulating layer 34c as shown in FIG. 5B. The process sequence is similar to the prior art process for fabricating the prior art solid state image sensing device until the semiconductor structure shown in FIG. 5B.

Subsequently, silicon oxide is deposited to 2 microns to 5 microns over the entire surface of the resultant semiconductor structure, and forms s silicon oxide layer. The thick transparent layer 38 is formed from the silicon oxide layer. The focal length of the buried miniature lens 32 is taken into account for determining the thickness of the silicon oxide layer. Phosphorous or boron may be introduced into the silicon oxide. The phosphorous or the boron prevents the thick transparent layer 38 from stress, and a crack is less liable to take place in the thick transparent layer 38. Otherwise, a plurality of transparent layers different in thermal expansion coefficient may be laminated so as to relief the thick transparent layer 38 from the internal stress. Moreover, the silicon oxide layer may be subjected to a chemical mechanical polishing so as to enhance the flatness of the upper layer 38b.

A photo resist etching mask 40 is provided on the thick transparent layer 38, and has an opening 40a over the photo diode 31. Using the photo resist etching mask 40, the thick transparent layer 38 is isotropically etched. The etchant may be dilute hydrofluoric acid. The generally semi-spherical recess 38a is formed in the thick transparent layer 38 through the isotropic etching as shown in figure 5C. It is possible to continue the isotropic etching just before separation of the photo resist etching mask 40 from the thick transparent layer 38. In the actual process, the manufacturer takes the optical characteristics of the buried miniature lens 32 into account, and optimizes the etching time. A suitable mask layer such as a silicon nitride layer may be formed between the photo resist etching mask and the thick transparent layer 38. In this instance, the photo resist etching mask 40 is used for patterning the mask layer, and the generally semi-spherical recess 38a is formed through the isotropic etching using the mask layer.

Subsequently, transparent material is deposited over the thick transparent layer 38. The transparent material fills the generally semi-spherical recess 38a, and swells into a transparent layer. The transparent layer is chemically mechanically polished until the upper surface 38b is exposed, and the buried miniature lens 32 is left in the generally semi-spherical recess 38a. The transparent material for the buried miniature lens 32 is larger in refractive index than the material forming the thick transparent layer 38. In this instance, the thick transparent layer 38 is formed of silicon oxide, and silicon nitride is deposited over the thick transparent layer 38. The refractive index of the silicon oxide is of the order of 1.6, and the silicon nitride has the refractive index of 2.0.

The radius of curvature of the generally semi-spherical recess 38a and the ratio of refractive index between the thick transparent layer 38 and the buried miniature lens 32 determine the focal length. The manufacturer appropriately selects the transparent material for the thick transparent layer 38, the transparent material for the buried miniature lens 32, the etching time and the thickness of the thick transparent layer 38 so as to optimize the focal length of the buried miniature lens 32.

Finally, the protective layer 39 is formed over the thick transparent layer 38 and the buried miniature lens 32. The protective layer 39 should be hard. In this instance, the protective layer 39 is formed of silicon nitride. Then, the solid state image sensing element shown in FIGS. 3 and 4 is fabricated on the n-type silicon substrate 36.

Second Embodiment

Figure 6:
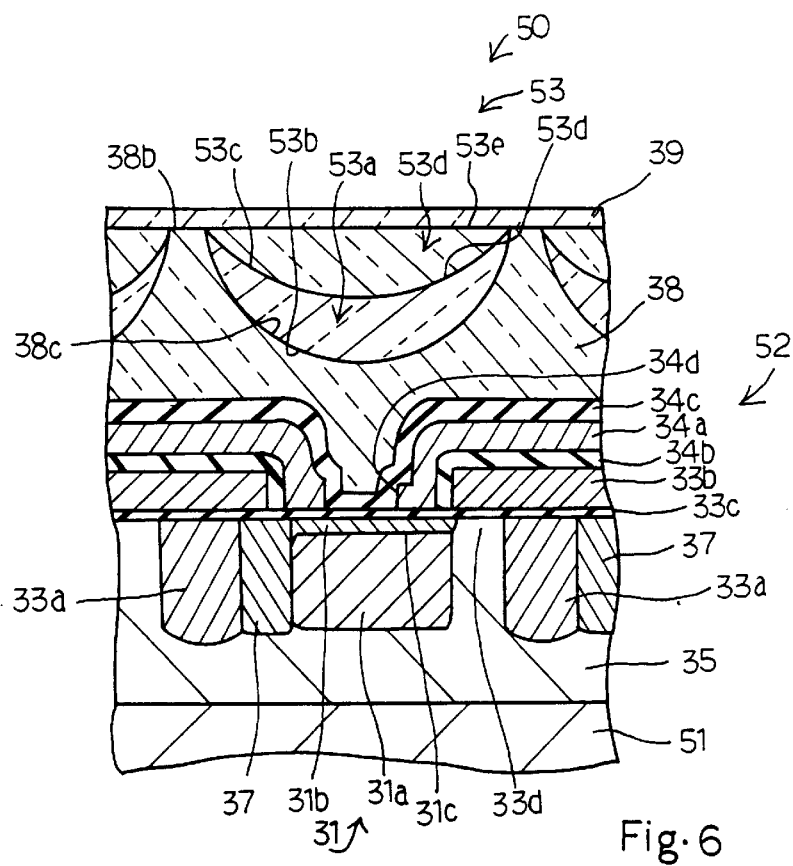
FIG. 6 is a cross sectional view showing the structure of another solid state image sensing element according to the present invention.

Turning to FIG. 6 of the drawings, another solid state image sensing element 50 embodying the present invention is fabricated on an n-type silicon substrate 51 together with a shift register 52. The shift register 52 is similar to that of the first embodiment, and the solid state image sensing element 50 is only different from the solid state image sensing element 30 in the structure of a buried miniature lens 53. For this reason, the component elements of the shift register 52 and the other component elements of the solid state image sensing element 50 are labeled with the same references designating corresponding elements of the shift register 33 and the corresponding elements of the solid state image sensing elements 30, and description is focused on the structure of the buried miniature lens 53 for the sake of simplicity.

The thick transparent layer 38 has a generally semi-spherical recess 38c that is partially filled with silicate glass, which is sometimes expressed as "SOG (Spin-On-Glass)", and the silicate glass forms a first transparent layer 53a. The first transparent layer 53a has a lower curved surface 53b and an upper curved surface 53c, and the lower curved surface 53b is merged with the upper curved surface 53c along the periphery of the first transparent layer 53a. Therefore, the first transparent layer 53a is thickest at the center thereof, and the thickness is decreased from the center toward the periphery. The lower surface 53b has the radius of curvature equal to that of the generally semi-spherical recess 38c, and the upper surface 53c has the radius of curvature greater than that of the lower surface 53b. Although the first transparent layer 53a does not participate in the convergence of light because of fact that the refractive index of the silicate glass is approximately equal to that of the silicon oxide, the first transparent layer 53a modifies the radius of curvature of a second transparent layer 53d serving as a convex lens.

As described hereinbefore, the first transparent layer 53a has the curved upper surface 53c, which defines a shallow recess 53d nested in the generally semi-spherical recess 38c. The shallow recess 53d is almost a generally semi-ellipsoid configuration. The shallow recess 53d is filled with transparent material such as, for example, silicon nitride greater in refractive index than the silica glass. The silicon nitride forms the second transparent layer 53d, and the second transparent 53d serves as a convex lens. The convex lens of the second transparent layer 53d has a flat upper surface 53e substantially coplanar with the upper surface 38b of the thick transparent layer 38, and the focal length is longer than that of the buried miniature lens 32. Thus, the radius of curvature of the upper surface 53c is changeable as will be described hereinafter, and the manufacturer can adjusts the focal length by changing not only the thickness of the thick transparent layer 38 but also the first transparent layer 53a.

The first transparent layer 53a is formed as follows. First, silica glass solution is prepared. The silica glass solution is spread over the thick transparent layer 38, and fills the generally semi-spherical recess 38c. The silica glass solution is baked. Then, the silica glass layer is shrunk, and forms the curved upper surface 53c. The shrinkage ratio is variable together with the water content of the silica glass solution. If the shrinkage ratio is 1:2, the generally semi-ellipsoid recess has the ratio of the minor axis to the major axis=1:2, and the focal length is twice increased rather than that of the generally semi-spherical lens. The first transparent layer 53a modifies the focal length of the convex lens, and serves as a focal length modifier.

When using the buried miniature lens 53, the designer easily optimizes the optical characteristics for the photo diode 31. Because there are various design factors independently changeable, i.e., the ratio of refractive index between the transparent material for the thick layer 38 and the transparent material for the convex lens 53d, the radius of curvature of the surface defining the generally semi-spherical recess 38c, the thickness of the transparent layer 38, the ratio of refractive index between the transparent material for the first transparent layer 53a and the transparent material for the convex lens 53d, the configuration of the curved upper surface 53c and the thickness of each transparent layer 38/53a/53d affect the optical characteristics of the solid state image sensing element 50, and the designer independently changes these factors.

Third Embodiment

Figure 7:
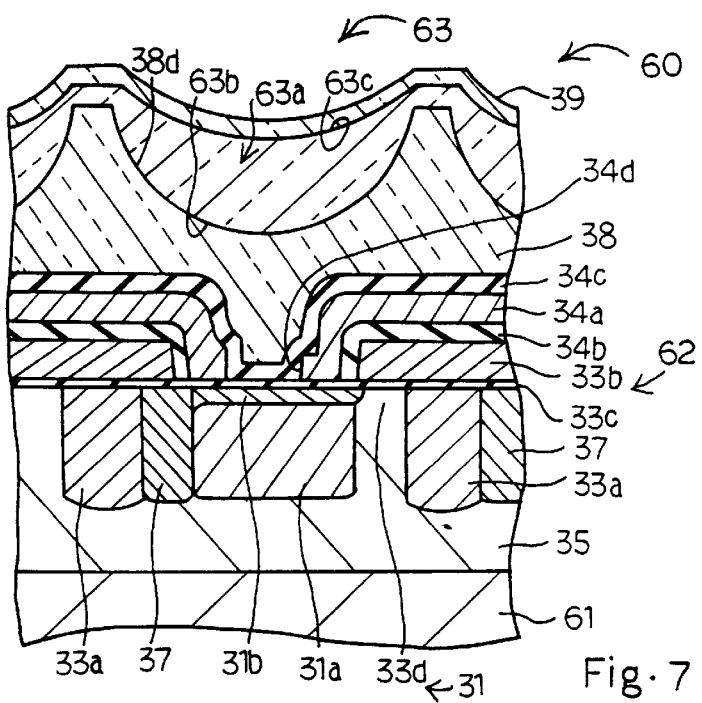
FIG. 7 is a cross sectional view showing the structure of yet another solid state image sensing element according to the present invention.

FIG. 7 illustrates yet another solid state image sensing element 60 embodying the present invention. The solid state image sensing element 60 is fabricated on an n-type silicon substrate 61 together with a shift register 62. The shift register 62 is similar to that of the first embodiment, and the solid state image sensing element 60 is only different from the solid state image sensing element 30 in the structure of a buried miniature lens 63. For this reason, the component elements of the shift register 62 and the other component elements of the solid state image sensing element 60 are labeled with the same references designating corresponding elements of the shift register 33 and the corresponding elements of the solid state image sensing elements 30, and description is focused on the structure of the buried miniature lens 63 for the sake of simplicity.

The thick transparent layer 38 has a generally semi-spherical recess 38d, and the buried miniature lens 63 is provided in the generally semi-spherical recess 38d. The buried miniature lens 63 is implemented by a transparent layer 63a. A lower surface 63b of the transparent layer 63a follows the curved surface defining the generally semi-spherical recess 38c, and an upper surface 63c is also curved so as to define a shallow recess. The upper surface 63c is larger in radius of curvature than the lower surface 63b, and the transparent layer 63a is increased in thickness from the periphery to the center thereof. For this reason, the transparent layer 63a serves as a convex lens.

The solid state image sensing element 63 is fabricated as follows. A process for fabricating the photo-electric element 63 is similar to that of the first embodiment until the step of forming the generally semi-spherical recess 38d. Solution of mixture of $TiO_2$ and silica glass or $SrTiO_3$ and silica glass is, by way of example, prepared, and is spread over the entire surface of the thick transparent layer. The layer of the solution is baked so as to form the transparent layer 63a. When the mixture of $TiO_2$ and silica glass is used, the transparent layer 63a has the refractive index ranging between 2.3 and 2.5, which is greater than the refractive index of the silicon oxide forming the thick transparent layer 38. Finally, the resultant semi-conductor structure is covered with the protective layer 39, which topographically extends over the transparent layer 63a.

In this instance, the shrinkage ratio is variable as similar to the silica glass used in the second embodiment, and the focal length is appropriately regulable. The solution of mixture does not form a flat upper surface. However, the transparent layer 63a is harder than the baked photo resist layer, and is not easily damaged. Moreover, the protective layer 39 prevents the convex lens 63a from scratches due to a dust particle. For this reason, even if a dust particle is left in the shallow recess, the dust-particle is easily eliminated from the shallow recess.

The solid state image sensing element 60 forms a part of a solid state image sensing device, and the solid state image sensing device may be sealed in a plastic package. Even though the plastic package does not form a space over the protective layer 39, the upper surface 63c and, accordingly, the protective layer 39 have a large radius of curvature, and the plastic package does not widely change the focal plane. The plastic package affects the radius of curvature. However, the variation is a little and predictable. For this reason, the manufacturer takes the variation into account so as to determine the design factors of the buried miniature lens 63.

Fourth Embodiment

Turning to FIG. 8 of the drawings, still another solid state image sensing element 70 is fabricated on an n-type silicon substrate 71 together with a shift register 72. The shift register 72 is similar to that of the first embodiment, and the solid state image sensing element 70 is only different from the solid state image sensing element 30 in the structure of a buried miniature lens 73. For this reason, the component elements of the shift register 72 and the other component elements of the solid state image sensing element 70 are labeled with the same references designating corresponding elements of the shift register 33 and the corresponding elements of the solid state image sensing elements 30, and description is focused on the structure of the buried miniature lens 73 for the sake of simplicity.

A thick transparent layer 74 is formed over the photo diode 31 and the shift register 72, and a generally semi-ellipsoid recess 74a is formed in the thick transparent layer 74 over the photo diode 31. A transparent layer 73a fills the generally semi-ellipsoid recess 74a, and serves as a convex lens.

The solid state image sensing element 70 is fabricated as follows. A process for fabricating the solid state image sensing element 70 is similar to the process shown in FIGS. 5A to 5C until the step of forming the transparent insulating layer 34c. Undoped silicon oxide is deposited over the entire surface of the resultant semiconductor structure, and phosphorous is ion implanted into a surface portion of the undoped silicon oxide layer. Otherwise, phosphorous-containing additive gas such as $PH_3$ is mixed with the material gas such as $SiH_4$, and the amount of the phosphorous-containing additive gas is controlled in such a manner as to increase the concentration toward the upper surface of the silicon oxide layer. As a result, a thick phosphorous-doped silicon oxide layer 74b is formed on the transparent insulating layer 34c.

Figure 11:
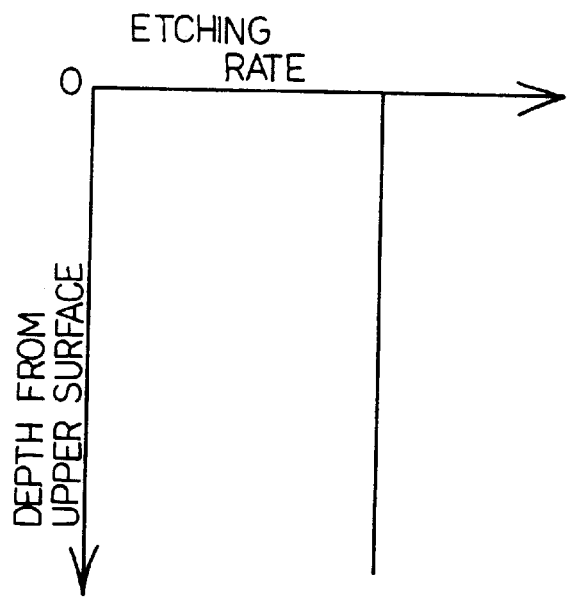
FIG. 11 is a graph showing relation between an etching rate and a depth from the boundary between another transparent layer and a photo resist layer.
Figure 12:
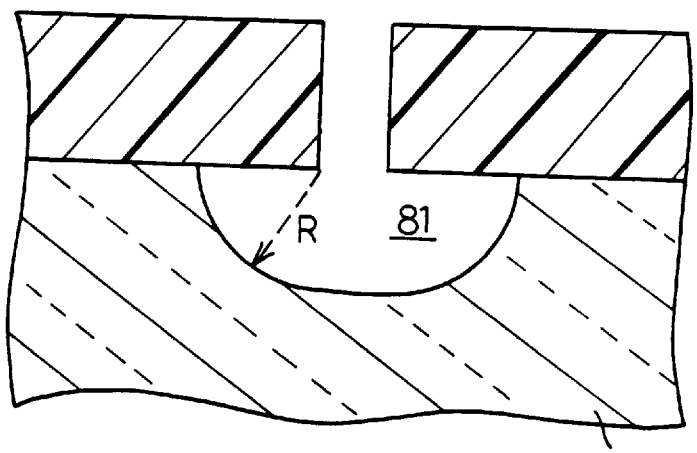
FIG. 12 is a cross sectional view showing a semi-spherical recess formed in the transparent layer.

Subsequently, a photo resist etching mask 75 is formed on the upper surface of the phosphorous-doped silicon oxide layer 74b (see FIG. 9), and has an opening 75a over the photo diode 31. Using dilute hydrofluoric acid, the phosphorous-doped silicon oxide layer 74b is isotropically etched away. The etching rate is proportional to the phosphorous concentration, and the etching rate is gradually decreased from the upper surface of the phosphorous-doped silicon oxide layer 74b toward the inside thereof as shown in FIG. 10. For this reason, the isotropic etching widely proceeds in the lateral direction, and R1 becomes greater than R2. As a result, the generally semi-ellipsoid recess 74a is formed in the phosphorous-doped silicon oxide layer 74b. If a transparent layer has a constant dopant concentration as shown in FIG. 11, the etching rate is constant over the thickness of the transparent layer, and the etchant forms a semi-spherical recess or a generally semi-spherical recess 81 in the transparent layer 82 as shown in FIG. 12. When the dopant profile is changed, the generally elliptical recess varies the configuration. Thus, the manufacturer can optimize the optical properties of the buried miniature lens 73a by controlling the conditions of the ion-implantation or the conditions of the chemical vapor deposition.

Subsequently, transparent material is formed over the transparent layer 74. The transparent material fills the generally ellipsoid recess 74a, and the transparent material layer is planarized. The chemically mechanically polishing may be used. The transparent material is larger in refractive index than the phosphorous-doped silicon oxide, and the piece of transparent material in the recess 74a serves as a convex lens. Finally, the protective layer 39 is formed.

Solid State Image Sensing Device

Each of the solid state image sensing elements 30, 50, 60 and 70 is available for a solid state image sensing device.

Figure 13:
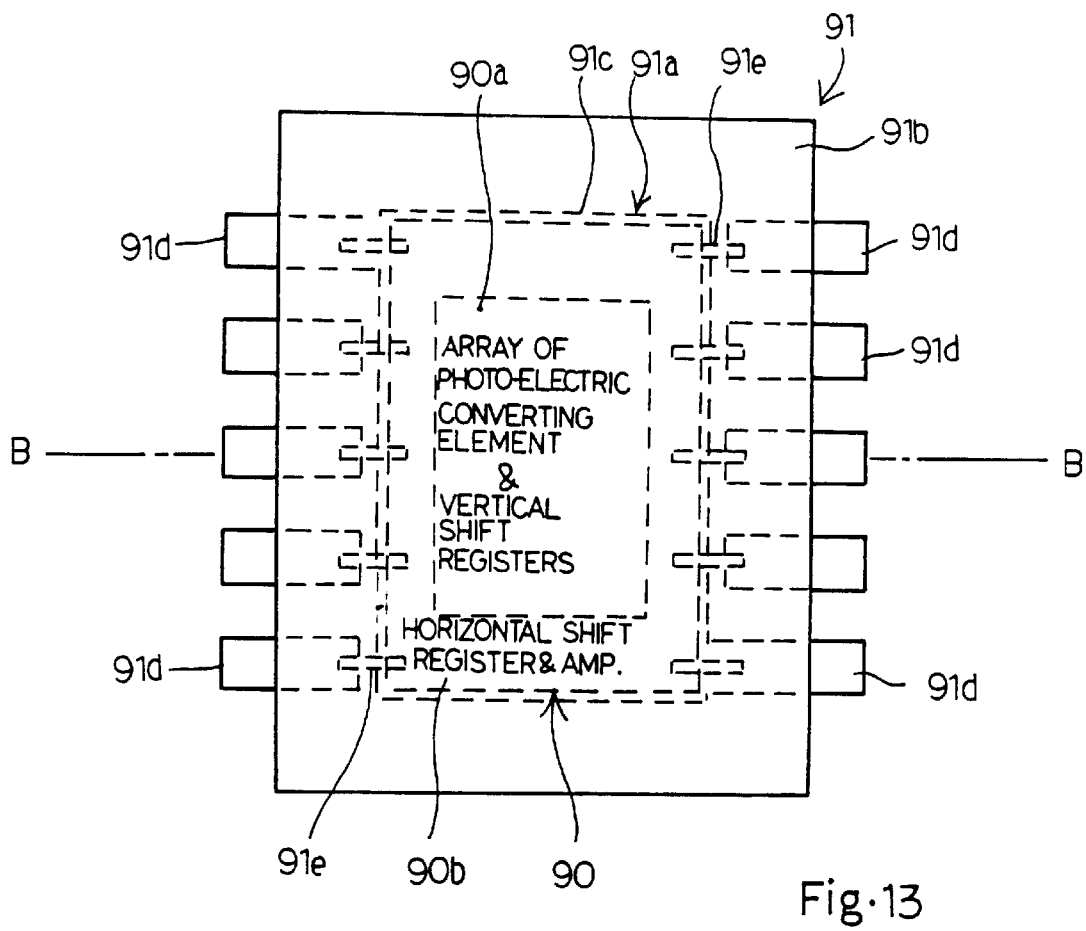
FIG. 13 is a plane view showing the layout a solid state image sensing device according to the present invention.

The solid state image sensing device is broken down into a semi-conductor chip 90 and a plastic package 91 as shown in FIG. 13. The semi-conductor chip 90 is divided into a central area 90a and a peripheral area 90b. The central area 90a is assigned to an array of solid state image sensing elements and vertical shift registers, and the peripheral area 90b is assigned to a horizontal shift register and an amplifier. A kind of solid state image sensing element 30/50/60/70 forms a part of the array together with other solid state image sensing elements of the same type, and each of the shift registers is same as the shift register 33/52/62/72. The horizontal register and the amplifier are well known to a person skilled in the art, and no further description is incorporated hereinbelow.

The plastic package 91 includes a lead frame 91a and a piece of transparent synthetic resin 91b. The lead frame 91a has an island 91c for mounting the semiconductor chip 90, conductive leads 91d projecting from both sides of the piece of synthetic resin 91b and conductive wires 91e connected between the semiconductor chip 90 and the conductive leads 91d. In this instance, the semiconductor chip 90 is directly covered with the transparent synthetic resin 91b. However, a silicone resin layer may be inserted between the upper surface of the semiconductor chip 90 and the piece of transparent synthetic resin 91b. Even if color filters are provided on the semiconductor chips, the color filters form a flat upper surface, and the silicone resin layer is insertable between the color filters and the piece of transparent synthetic resin 91b.

Figure 14:
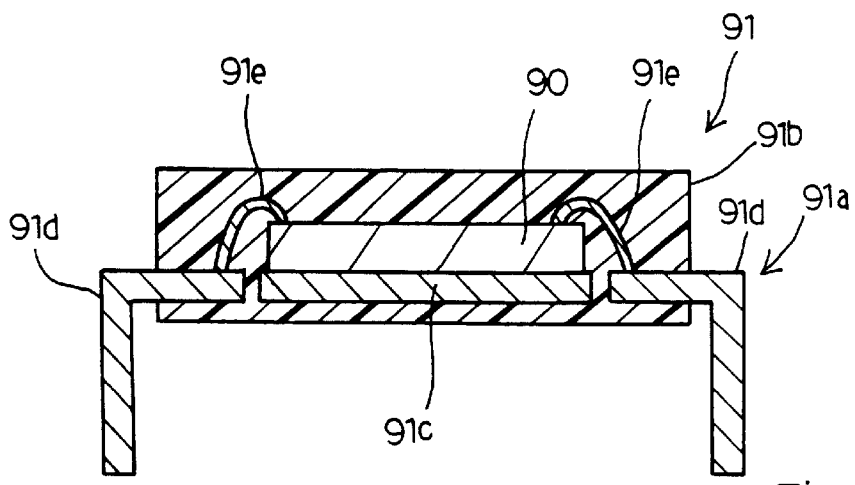
FIG. 14 is a cross sectional view taken along line B—B of FIG. 13 and showing the structure of the solid state image sensing device.

The solid state image sensing device is assembled as follows. First, the semiconductor chip 90 is mounted on the island 91c, and the conductive wires 91e are bonded to pads on the semiconductor chip/island 91b/91c and the conductive leads 91d. The semiconductor chip 90 mounted on the lead frame 91a is placed in a molding die (not shown), and melted transparent synthetic resin is injected into the molding die. Then, the semiconductor chip 90 is sealed in the piece of transparent synthetic resin 91b. Finally, the conductive leads 91d are separated from a frame (not shown), and are bend as shown in FIG. 14.

The protective layers 39 on the solid state image sensing elements 30/50/70 create the flat upper surfaces, and the piece of transparent synthetic resin 91b does not have any influence on the buried miniature lens regardless of the refractive index of the transparent synthetic resin. However, the protective layer 39 is curved. If the transparent synthetic resin 91b is different in refractive index from the transparent layer 63a, the piece of transparent synthetic resin 91b affects the optical characteristics of the buried miniature lens 63. Nevertheless, the optical influence is a little, because the transparent layer 63a has a large radius of curvature. Moreover, the optical influence is predictable, and the manufacturer can take the optical influence into account in the design work for the buried miniature lens 63. Thus, the semiconductor chip 90 is packaged in the piece of transparent synthetic resin without space over the semiconductor chip 90, and the solid state image sensing device is provided to the market at low price.

Figure 15:
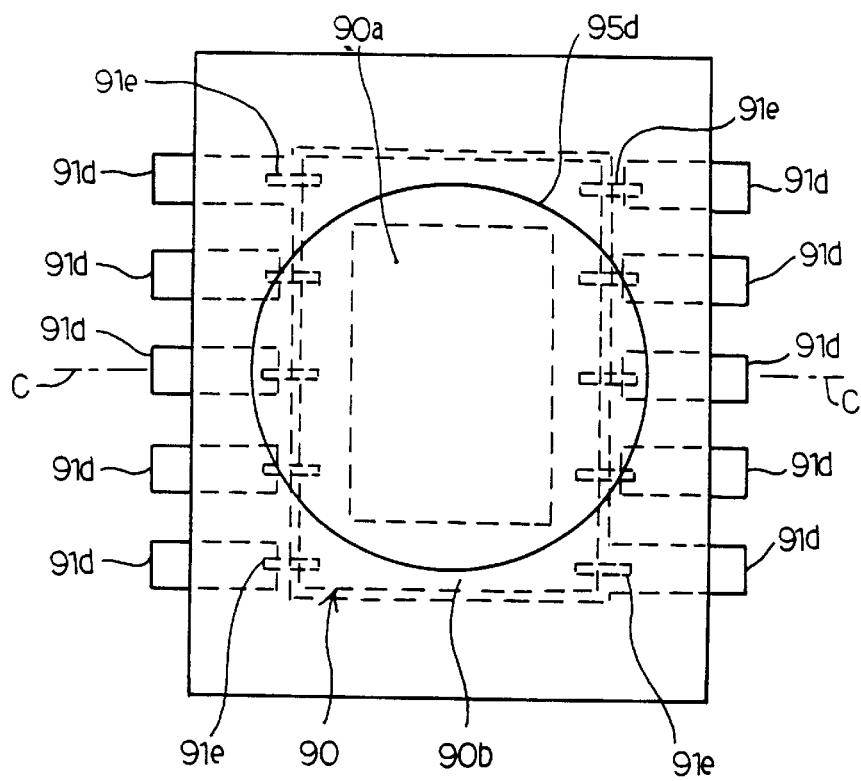
FIG. 15 is a plane view showing the layout another solid state image sensing device according to the present invention.
Figure 16:
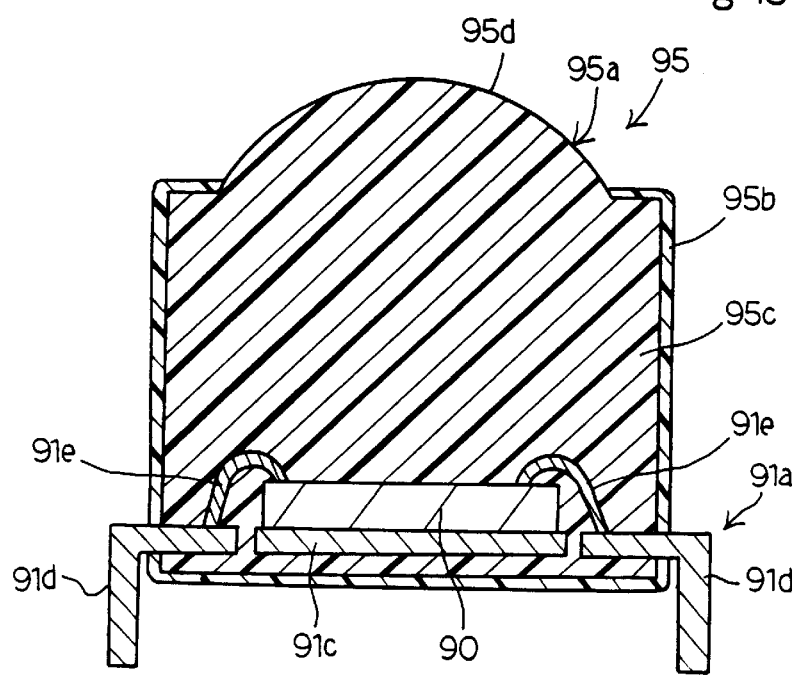
FIG. 16 is a cross sectional view taken along line C—C of FIG. 15 and showing the structure of the solid state image sensing device.

FIGS. 15 and 16 illustrate another solid state image sensing device embodying the present invention. The solid state image sensing device is similar to that shown in FIGS. 13 and 14. The solid state image sensing device shown in FIGS. 15 and 16 is sealed in a different kind of plastic package 95, and the piece of transparent synthetic resin 91b is replaced with a piece of transparent synthetic resin 95a partially covered with a photo-shield layer 95b. For this reason, other components are labeled with the same references designating corresponding components of the solid state image sensing device shown in FIGS. 13 and 14.

The piece of transparent synthetic resin 91b has a sealing portion 95c and a convex portion 95d. The semiconductor chip 90 mounted on the lead frame 91a is sealed in the sealing portion 95c, and the convex portion 95d is formed on the upper surface of the sealing portion 95c. The sealing portion 95c is covered with the photo-shield layer 95b, and light is incident onto the convex portion 95d. In this instance, the photo-shield layer 95b is formed of black insulating paint. The convex portion 95d serves as a fixed focus lens. The sealing portion 95c and the convex portion 95d are molded, and, thereafter, the sealing portion 95c is coated with the black insulating paint. The solid state image sensing device with the fixed focus lens is appropriate for an economical camera.

As will be appreciated from the foregoing description, the solid state image sensing element according to the present invention does not project a lens from the transparent layer, and the lens is not mechanically damaged. Moreover, even if the solid state image sensing element is contaminated with dust particles, the manufacturer easily eliminate the dust particles from the solid state image sensing element by using a blower. In other words, the solid state image sensing element does not require perfectly dust-free ambience, and the production cost is drastically reduced. The buried miniature lens occupies wide area over the photo diode and the shift register, and makes the solid state image sensing element sensitive.

The protective layer 39 perfectly prevents the solid state image sensing element from external force and contaminant, and makes the solid state image sensing element durable.

The solid state image sensing device according to the present invention does not require any space between a package and the semiconductor chip, and the simple package reduces the production cost.

Although particular embodiments of the present invention have been shown and described, it will be obvious to those skilled in the art that various changes and modifications may be made without departing from the spirit and scope of the present invention.

In the above-described embodiment, the buried miniature lens 32 has a circular cross section. However, the cross section may be deformed in accordance with the plane configuration of the photo diode. For example, if a photo diode has a rectangle and the opening of the photo-shield layer is a rectangle nested in the photo diode, the buried miniature lens may be elongated in the direction of the long edge of the rectangle so as to have an elliptical cross section. Then the elliptical buried miniature lens effectively focuses incident light onto the photo diode.

The protective layer 39 may be deleted from the solid state image sensing device. The silicon oxide and the silicon nitride are harder than the photo resist of the second prior art, and the buried miniature lens 32 and the thick transparent layer 38 are less damaged.

The focal length modifier may be implemented by more than one silica glass layer.

Any transparent material is available for the focal length modifier 53a or the convex lens 63a in so far as it anisotropically shrinks during the solidification. Another transparent materials in the silica glass system is an example. Yet another example is low-fusing point glass.

If the solid state image sensing element is incorporated in a full color image sensing device, a color filter element is inserted between the transparent insulating layer 34c and the buried miniature lens, or is provided on the buried miniature lens.

A convex lens of glass may be adhered to the sealing portion 95c without the convex portion 95d.

The invention, the present invention is applicable to the MOS type.

What is claimed is:

1. A process for fabricating a solid state image sensing element, comprising the steps of a) preparing a substrate;
  b) forming a photo-electric converting element in a first area of said substrate;
  b1) forming a photo-shield layer over said photo-electric converting element and defining an opening in which at least a part of said photo-electric converting element is exposed;
  c) covering said photo-shield layer with a first transparent layer formed of a first transparent material;
  d) forming a mask layer on said first transparent layer having an opening over a central sub-area of said first area;
  e) isotrophically etching said first transparent so as to form a first recess, wherein said first recess occupies a second area wider than said first area and is shaped independent of the configuration of said opening; and
  f) filing said first recess with a second transparent material larger in refractive index than said first transparent material so as to form a second transparent layer serving as a lens.

2. The process as set forth in claim 1, in which said step f) includes the sub-steps of f-1) spreading solution of said second transparent material over said first transparent layer,
  f-2) solidifying the layer of said solution so as to be shrunk into said second transparent layer.

3. The process as set forth in claim 1, further comprising the step of g) planarizing the resultant structure of said step f) so as to create a flat upper surface.

4. The process as set forth in claim 3, further comprising the step of h) covering said flat upper surface with a protective layer formed of a third transparent material harder than said second transparent material.

5. The process as set forth in claim 1, in which said second material is silica glass.

6. The process as set forth in claim 1, in which an etching rate of said first transparent layer is decreased from an upper surface toward a lower surface.

7. The process as set forth in claim 6, in which said etching rate is varied by changing the concentration of an impurity.

8. The process as set forth in claim 7, in which said concentration of impurity is changed through an ion-implantation.

9. The process as set forth claim 7, in which said first transparent layer is formed through a chemical vapor deposition of a material gas for said second transparent material, and said concentration of impurity is changed by controlling an additive gas for said impurity mixed with said material gas.

* * * * *

UNITED STATES PATENT AND TRADEMARK OFFICE
CERTIFICATE OF CORRECTION

PATENT NO. : 6,291,811 B1
DATED : September 18, 2001
INVENTOR(S) : Chihiro Ogawa It is certified that error appears in the above-identified patent and that said Letters Patent is hereby corrected as shown below:

Column 2,
Line 33, delete "279" insert -- 27c --

Signed and Sealed this

Ninth Day of April, 2002

Attest:

*Attesting Officer*

JAMES E. ROGAN
*Director of the United States Patent and Trademark Office*